US007684270B2

(12) United States Patent
Hirota et al.

(10) Patent No.: US 7,684,270 B2
(45) Date of Patent: Mar. 23, 2010

(54) EQUALIZER CIRCUIT AND METHOD OF CONTROLLING THE SAME

(75) Inventors: Takuya Hirota, Kanagawa (JP); Takao Yanagida, Kanagawa (JP); Hiroyuki Takahashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 21 days.

(21) Appl. No.: 11/892,488

(22) Filed: Aug. 23, 2007

(65) Prior Publication Data

US 2008/0049530 A1 Feb. 28, 2008

(30) Foreign Application Priority Data

Aug. 24, 2006 (JP) ............................ 2006-227446

(51) Int. Cl.
*G11C 7/02* (2006.01)

(52) U.S. Cl. ....................... 365/202; 365/203; 365/204; 365/205; 365/207; 365/226

(58) Field of Classification Search ................. 365/202, 365/203, 204, 205, 207, 226
See application file for complete search history.

(56) References Cited

U.S. PATENT DOCUMENTS 6,128,238 A * 10/2000 Nagai et al. ................. 365/207
6,181,618 B1 * 1/2001 Inaba et al. ................. 365/203
6,307,803 B1 * 10/2001 Chien ......................... 365/226
6,477,079 B2 * 11/2002 Kaneko et al. .............. 364/149
6,501,696 B1 * 12/2002 Mnich et al. ................ 365/207
6,667,919 B1 * 12/2003 Ma et al. .................... 365/201
6,917,550 B2 * 7/2005 Kawagoe et al. ............ 365/205
6,961,274 B2 * 11/2005 Jeong ......................... 365/203
6,990,028 B2 * 1/2006 Haga et al. .................. 365/205
7,133,321 B2 * 11/2006 Jung .......................... 365/202
7,245,549 B2 * 7/2007 Komura et al. ......... 365/230.03
7,280,422 B2 * 10/2007 Kim et al. ................... 365/203

FOREIGN PATENT DOCUMENTS

JP 2000260965 A * 9/2000
JP 2003-173679 6/2003
JP 2004348896 A * 12/2004

* cited by examiner

*Primary Examiner*—Viet Q Nguyen
(74) *Attorney, Agent, or Firm*—McGinn IP Law Group, PLLC

(57) ABSTRACT

In a conventional equalizer circuit, in an equalizing operation for setting voltages of a wiring pair having a predetermined voltage difference therebetween to be the same, it takes a long time to make the voltages of the wirings in a pair converge to a voltage having an offset with respect to a midpoint voltage of the voltages of the wiring pair after the equalizing operation. According to an equalizer circuit of the present invention, provided is an equalizer circuit (50) which sets the voltages of a first wiring (SAP) and a second wiring (SAN) to be substantially the same and which has a first transistor (N1) connected between the first wiring (SAP) and a first power supply circuit (for example, HVDD−Va) and a second transistor (N2) connected between the first wiring SAP and the second wiring (SAN). The equalizer circuit 50 makes the first transistor (N1) conductive, and then makes the second transistor (N2) conductive.

14 Claims, 10 Drawing Sheets

1
WD
10
11
Bit
Bit_B
GTr
C
HVDD
20
21
EN1
EN2
EN3
R
PDL
30
HVDD-Va
SAP
SAN
40
41
SP1
SP2
SN1
SN2
Y
OG1
OG2
D
DB
50
N1
N2
N3
60
HVDD-Va
70
CONTROL CIRCUIT
SWC2
SWC1
SE
INV
VDD-SW
VSS-SW
VDD
VSS

2
WD
Bit
Bit_B
GTr
C
HVDD
10
11
EN1
EN2
EN3
R
20
21
30
HVDD-Va
SAP
SAN
SP1
SP2
SN1
SN2
OG1
OG2
Y
D
DB
40
41
N1
N2
N3
50
60
HVDD-Va
DR_Tr
DC
CONTROL CIRCUIT
71
DC
PDL
SWC2
SWC1
SE
INV
VDD-SW
VSS-SW
VDD
VSS

3
WD
10
Bit
Bit_B
11
GTr
C
HVDD
20
21
EN1
EN2
EN3
R
30
HVDD-Va
SAP
SAN
40
41
SP1
SP2
SN1
SN2
OG1
OG2
Y
D
DB
51
N1
N2
N3
N4
60
HVDD-Va
72
CONTROL CIRCUIT
PDL
SWC2
SWC1
SE
INV
VDD-SW
VSS-SW
VDD
VSS

EQUALIZER CIRCUIT AND METHOD OF CONTROLLING THE SAME

BACKGROUND OF THE INVENTION

1. Field of the Invention

The present invention relates to an equalizer circuit and a method of controlling the same. In particular, the present invention relates to an equalizer circuit, in which voltages of a first wiring and a second wiring which are connected to the equalizer circuit, and which causes the voltages to have offsets with respect to a midpoint voltage of the voltages supplied to the two wirings, and a method of controlling the same.

2. Description of the Related Art

A volatile semiconductor memory device (hereinafter, referred to as "memory") such as a dynamic random access memory (DRAM) reads out data after differentially amplifying voltage difference generated in a pair of signal lines for the purpose of attaining high-speed operation. In the differential amplification, before reading out data, precharge operation and equalizing operation are performed for setting the voltages of the signal line pair to be substantially the same voltage (for example, a midpoint voltage between a power supply voltage and a ground voltage). After those operations are completed and an equalizer circuit is turned off, a gate transistor of a memory cell is made conductive, which generates a voltage difference between the signal lines of the pair. By differentially amplifying the voltage difference with a sense amplifier, the data is read out.

Further, in a DRAM, because charge held by a capacitor of the memory cell decreases over time and there is a fear that the stored data may be lost, it is necessary to perform a refresh operation to recharge the memory cell. Also in the refresh operation, first, the precharge operation is performed with respect to the signal line pair. Then, the gate transistor of the memory cell is made conductive and the voltage of one of the signal line pair is made close to the voltage of the memory cell, which generates a voltage, difference between the signal line pair. The voltage difference is differentially amplified by the sense amplifier to thereby increase the voltage of the signal line to which the memory cell is connected. As a result, the memory cell is recharged.

In recent years, many DRAMs are used also in portable equipment and the like. Therefore, those DRAMs are required to consume low power. However, a DRAM requires the refresh operation even when the DRAM is not accessed, and power is to be consumed in the refresh operation. Therefore, it is effective in lowering the power consumption of the DRAM to lower the power consumption in the refresh operation.

JP 2003-173679 A discloses a conventional technique relating to lowering of the power consumption in the refresh operation. The conventional technique decreases charge and discharge current with respect to a signal line pair by charge recycling. Further, by improving charge holding characteristics of the charge held in a capacitor of a memory cell, the frequency of the refresh operation is decreased. A semiconductor memory device according to the conventional technique lowers power consumption by those improvements.

An exemplary circuit disclosed in the conventional art is illustrated in FIG. 9. The circuit illustrated in FIG. 9 has sense amplifiers SA0 to SAn. A high-voltage-side power supply wiring SAP and a low-voltage-side power supply wiring SAN are each connected to the sense amplifiers SA0 to SAn. Further, one bit line Bit to which a memory cell is connected and the other bit line Bit_B for supplying a reference voltage to the sense amplifiers are each connected to the sense amplifiers SA0 to SAn. Still further, the bit lines Bit and Bit_B are connected to each other by an equalizer circuit EQ. The voltages of the bit lines Bit and Bit_B are the same when the equalizer circuit EQ is conductive. On the other hand, when the equalizer circuit EQ is nonconductive and the sense amplifiers SA0 to SAn are operated, the voltages of the bit lines Bit and Bit_B depend on an amount of charge stored in the memory cell, the voltage of the high-voltage-side power supply wiring SAP, and the voltage of the low-voltage-side power supply wiring SAN.

An NMOS transistor Ns is connected between the low-voltage-side power supply wiring SAN and a ground voltage VSS. A PMOS transistor Pd is connected between the high-voltage-side power supply wiring SAP and a power supply voltage VDD. Further, a PMOS transistor Pi is connected to the high-voltage-side power supply wiring SAP. A recycling capacitor CAP is connected between the PMOS transistor Pi and the ground voltage VSS.

FIG. 10 is a timing chart of the refresh operation of the circuit illustrated in FIG. 9. First, at a time Ta, the equalizer circuit is made nonconductive, the NMOS transistor Ns is made conductive, and the voltage of the low-voltage-side power supply wiring SAN is set as the ground voltage VSS. Further, the PMOS transistor Pi is made conductive, and the voltage of the high-voltage-side power supply wiring SAP set as VIID (i.e., voltage of a terminal of the recycling capacitor CAP on the side of the transistor Pi) (time Ta). In this case, the high-voltage-side power supply wiring SAP is charged with charge stored in the recycling capacitor CAP (time Tb), which operates the sense amplifiers SA0 to San. Accordingly, the voltages of the bit lines Bit and Bit_B are set based on the voltages of the high-voltage-side power supply wiring SAP and the low-voltage-side power supply wiring SAN, respectively.

Then, the PMOS transistor Pi is made nonconductive while the PMOS transistor Pd is made conductive. As a result, the voltage of the high-voltage-side power supply wiring SAP is set as the power supply voltage VDD. After that, the PMOS transistor Pi is made conductive while the PMOS transistor Pd is made nonconductive. As a result, the charge in the high-voltage-side power supply wiring SAP is stored (or recycled) in the recycling capacitor CAP, and the voltage of the high-voltage-side power supply wiring SAP is set as VIID (time Tc). Then, the PMOS transistor Pi and the NMOS transistor Ns are made nonconductive and the equalizer circuit EQ is made conductive to thereby connect the bit lines Bit and Bit_B to each other. As a result, the voltages of the bit lines Bit and Bit_B are set as the same voltage VIID/2 (time Td).

Specifically, in the conventional circuit, charge corresponding to the voltage difference between a first voltage (for example, the power supply voltage) and a second voltage (the voltage VIID) is stored in the recycling capacitor CAP. By recycling the stored charge in the subsequent refresh operation, consumption of the charge corresponding to the voltage difference is lowered to realize low power consumption.

Further, in the conventional circuit, the voltage of the bit lines Bit and Bit_B after the refresh operation (precharge voltage) is lower than half of the power supply voltage VDD. The precharge voltage is a reference voltage of the sense amplifiers. If the voltage becomes lower, time required for the voltage of the memory cell to drop due to leakage current to reach the reference voltage can be made longer. Specifically, the conventional circuit can decrease the frequency of the refresh operation. Further, the conventional circuit can lower the power consumption in the refresh operation.

However, the conventional circuit needs time for charging from the recycling capacitor CAP to the high-voltage-side power supply wiring SAP. There is a problem in that the charging time prevents a high-speed operation. Further, a capacitor generally requires a larger layout area than other elements. Therefore, when such a recycling capacitor is formed on the same substrate, there is a problem in that a chip area is increased.

SUMMARY OF THE INVENTION

According to the present invention, there is provided an equalizer circuit for setting voltages of a first wiring and a second wiring to be substantially the same, including: a first power supply line; a first transistor connected between the first wiring and the first power supply line; and a second transistor connected between the first wiring and the second wiring, in which the first transistor is made conductive, and then the second transistor is made conductive.

In the equalizer circuit according to the present invention, first, by making the first transistor conductive, for example, the voltage of the first wiring to which a power supply voltage VDD is supplied is made closer to a reference voltage in a shorter period of time than that of the second wiring to which a ground voltage VSS is supplied. This makes both smaller the voltage difference between the first and second wirings. After that, the second transistor is made conductive. This makes the voltages of the first and second wirings converge to a voltage lower than half of the power supply voltage VDD (for example, HVDD). Specifically, in the equalizer circuit according to the present invention, when the voltages of the first and second wirings are made to be substantially the same, the voltage can be set to be a voltage having an offset with respect to HVDD. This makes it possible to set a precharge voltage to be lower than HVDD, make longer an interval between refresh operations, and to lower the power consumption in the refresh operations.

Further, in the equalizer circuit according to the present invention, unlike the conventional case, charge and discharge are not necessary when the potential of the first wiring is made to change. Specifically, in the equalizer circuit according to the present invention, the precharge operation can be performed in a shorter time than in the case of the conventional circuit.

Meanwhile, a method of controlling an equalizer circuit according to the present invention is a method of controlling an equalizer circuit which controls both the voltages of the first and second wirings to be set to be the reference voltage generated by a reference voltage generating circuit. The method makes smaller the difference between the voltage of the first wiring and the reference voltage, and then sets the voltages of the first and second wirings to be substantially the same.

In the method of controlling an equalizer circuit according to the present invention, first, the difference between the voltage of the first wiring and the reference voltage is made smaller. After that, the voltages of the first and second wirings are set to be substantially the same. As a result, even when the precharge voltage have an offset with respect to HVDD, based on the operation of the equalizer circuit, both the voltage of the first wiring and the voltage of the second wiring can be set to be the precharge voltage having the offset with respect to HVDD.

Further, according to the present invention, there is provided a semiconductor memory device including: a sense amplifier for amplifying a potential difference between a pair of bit lines; a first wiring and the second wiring for supplying power supply potentials to the sense amplifier; and an equalizer circuit for equalizing potentials of the first wiring and the second wiring, in which the equalizer circuit equalizes the potentials of the first wiring and the second wiring based on a first control signal and a second control signal.

By equalizing the potentials of the wirings using the first control signal and the second control signal, time necessary for the precharge operation can be made shorter than that of the conventional case.

According to the equalizer circuit of the present invention, even when the precharge voltage has an offset with respect to a midpoint voltage of the voltage supplied to the first wiring and the voltage supplied to the second wiring, based on the operation of the equalizer circuit, both the voltages of the first and second wirings can be set to be the precharge voltage.

DETAILED DESCRIPTION OF THE PREFERRED EMBODIMENTS

Embodiment 1

Figure 1:
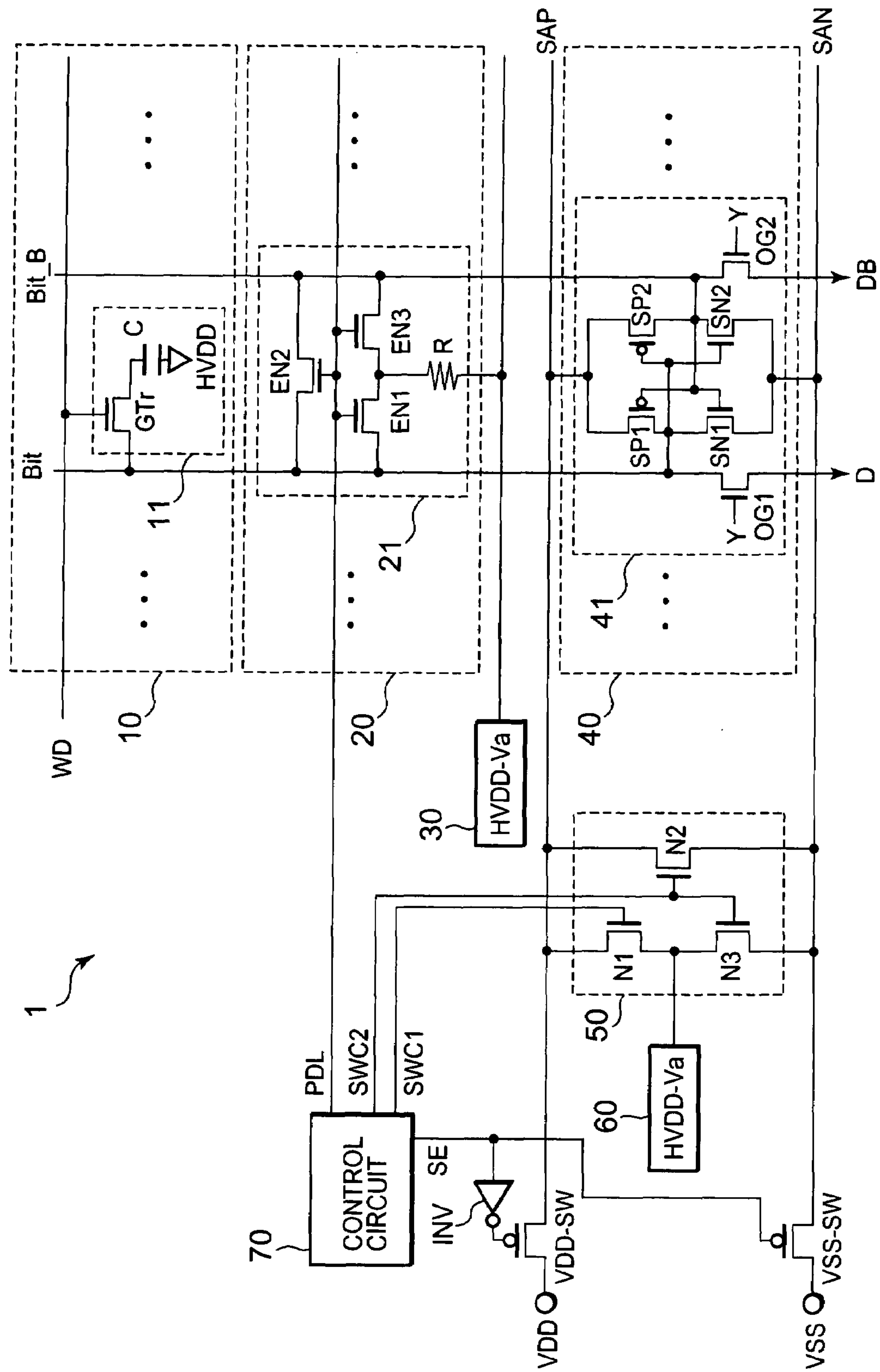
FIG. 1 is a circuit diagram of a DRAM having an equalizer circuit according to Embodiment 1 of the present invention.

In the following, a case where an equalizer circuit according to the present invention is applied to power supply wirings of a sense amplifier of a DRAM is described. FIG. 1 is a circuit diagram of a DRAM 1 according to Embodiment 1. As illustrated in FIG. 1, the DRAM 1 has a memory cell array 10, a group 20 of bit line equalizer circuits, a bit line reference voltage generating circuit 30, a group 40 of sense amplifiers, an SA equalizer circuit 50, an SA reference voltage generating circuit 60, and a control circuit 70.

The memory cell array 10 has a plurality of memory cells 11. The memory cells 11 are arranged on the memory cell array 10 so as to be lattice-like. The memory cells 11 are connected to either one of a bit line Bit or a bit line Bit_B. In FIG. 1, the memory cells 11 are connected to the bit line Bit.

The memory cell 11 has a gate transistor GTr and a capacitor C. A drain of the gate transistor GTr is connected to the bit line Bit and a word control signal WD is inputted to a gate of the gate transistor GTr. The word control signal WD is a control signal outputted by a word driver (not shown) and controls the conductivity of the gate transistor GTr. One terminal of the capacitor C is connected to a source of the gate transistor GTr. A bias voltage HVDD which is, for example, half of a power supply voltage VDD is supplied to the other terminal of the capacitor C.

The group 20 of bit line equalizer circuits has a plurality of bit line equalizer circuits 21. The bit line equalizer circuit 21 is connected between a pair of bit lines. In FIG. 1, one bit line of the pair of bit lines is the bit line Bit and the other bit line is the bit line Bit_B.

The bit line equalizer circuit 21 has NMOS transistors EN1 to EN3 and a current limiting resistor R. One end of the current limiting resistor R is connected to the bit line reference voltage generating circuit 30 and the other end of the current limiting resistor R is connected to sources of the NMOS transistors EN1 and EN3. A drain of the NMOS transistor EN1 is connected to the bit line Bit while a drain of the NMOS transistor EN3 is connected to the bit line Bit_B. The NMOS transistor EN2 is connected between the bit line Bit and the bit line Bit_B. A precharge control signal PDL is inputted to gates of the NMOS transistors EN1 to EN3. The precharge control signal PDL is a signal outputted by the control circuit 70 and controls the conductivity of the NMOS transistors EN1 to EN3. It should be noted that the current limiting resistor R is a resistance inserted in order to decrease leakage current from the bit line reference voltage generating circuit 30 to the word driver due to open or short circuit defects caused in the gate transistor GTr. Therefore, the current limiting resistor R is not necessarily required. Further, the current limiting resistor R may be a current limiting transistor.

The bit line reference voltage generating circuit 30 is, for example, a step down circuit for stepping down the power supply voltage VDD to generate a predetermined voltage, and generates a reference voltage (for example, a precharge voltage) HVDD−Va and the reference voltage outputs to a first power supply line, which is half the power supply voltage VDD (hereinafter referred to as HVDD) minus an offset voltage Va. The precharge voltage HVDD−Va is supplied to the bit line pair in precharge operation of the bit line pair. In this case, the precharge operation is an operation to make the voltage of the bit line pair a predetermined voltage. The operation sets the voltage of the bit line pair when the memory cell 11 holds charge. A first power supply line is a line which is connected to a node between a transistor N1 and N3 in FIG. 1.

The group 40 of sense amplifiers has a plurality of sense amplifiers 41. The sense amplifier 41 is connected between the bit lines of the pair to differentially amplify the voltage difference generated in the bit line pair. The sense amplifier 41 is operated based on the voltage supplied to a first wiring (for example, a high-voltage-side power supply wiring SAP) and a second wiring (for example, a low-voltage-side power supply wiring SAN). The sense amplifier 41 has PMOS transistors SP1 and SP2, NMOS transistors SN1 and SN2, and output gate transistors OG1 and OG2.

The PMOS transistor SP1 and the NMOS transistor SN1 are connected in series between the high-voltage-side power supply wiring SAP and the low-voltage-side power supply wiring SAN. The PMOS transistor SP2 and the NMOS transistor SN2 are connected in series between the high-voltage-side power supply wiring SAP and the low-voltage-side power supply wiring SAN. Gates of the PMOS transistor SP1 and the NMOS transistor SN1 are connected to a node between the PMOS transistor SP2 and the NMOS transistor SN2 and to the bit line Bit_B. Gates of the PMOS transistor SP2 and the NMOS transistor SN2 are connected to a node between the PMOS transistor SP1 and the NMOS transistor SN1 and to the bit line Bit. A source of the output gate transistor OG1 is connected to the bit line Bit while a source of the output gate transistor OG2 is connected to the bit line Bit_B. An output control signal Y is outputted to the gates of the output gate transistors OG1 and OG2. Drains of the output gate transistors OG1 and OG2 output the voltage of a corresponding bit line according to the value of the output control signal Y.

The SA equalizer circuit 50 has first to third transistors (for example, NMOS transistors N1 to N3). Sources of the NMOS transistors N1 and N3 are connected to each other, and the SA reference voltage generating circuit 60 is connected to a node between the sources of the NMOS transistors N1 and N3. A drain of the NMOS transistor N1 is connected to the high-voltage-side power supply wiring SAP while a drain of the NMOS transistor N3 is connected to the low-voltage-side power supply wiring SAN. The NMOS transistor N2 is connected between the high-voltage-side power supply wiring SAP and the low-voltage-side power supply wiring SAN. A first control signal SWC1 is supplied to a gate of the NMOS transistor N1 while a second control signal SWC2 is supplied to gates of the NMOS transistors N2 and N3. In other words, a discharge path from the power supply wiring SAP to the reference voltage generating circuit is activated.

The first control signal SWC1 and the second control signal SWC2 are signals outputted by the control circuit 70. The control circuit 70 also outputs a third control signal SE. The third control signal SE is a signal which controls the conductivity of power supply switches VDD_SW and VSS_SW.

The power supply switch VDD_SW is, for example, a PMOS transistor, and is connected between a power supply terminal and the high-voltage-side power supply wiring SAP. The power supply switch VSS_SW is, for example, an NMOS transistor, and is connected between a ground terminal and the low-voltage-side power supply wiring SAN. When the power supply switches VDD_SW and VSS_SW are conductive, the power supply voltage VDD (original voltage of the SAP) is supplied to the high-voltage-side power supply wiring SAP while the ground voltage VSS (original voltage of the SAN) is supplied to the low-voltage-side power supply wiring SAN. On the other hand, when the power supply switches VDD_SW and VSS_SW are nonconductive, the high-voltage-side power supply wiring SAP is disconnected from the power supply terminal while the low-voltage-side power supply wiring SAN is disconnected from the ground terminal.

The SA reference voltage generating circuit 60 is, for example, a step down circuit for stepping down the power supply voltage VDD to generate a predetermined voltage, and generates a precharge voltage HVDD−Va, which is HVDD minus the offset voltage Va. The precharge voltage HVDD−Va is supplied to a power supply wiring pair formed of the high-voltage-side power supply wiring SAP and the low-voltage-side power supply wiring SAN in a precharge operation of the power supply wiring pair. The voltage of the power supply wiring pair in the precharge operation of the present embodiment is set to be the precharge voltage HVDD−Va. It should be noted that the SA reference voltage generating circuit 60 and the bit line reference voltage generating circuit 30 are not necessarily required to be separate and they may be one circuit.

The control circuit 70 generates the precharge control signal PDL, the first control signal SWC1, the second control signal SWC2, and the third control signal SE. Specifically, the control circuit 70 controls the bit line equalizer circuits 21, the SA equalizer circuit 50, and the power supply switches VDD_SW and VSS_SW with the signals it generates.

Figure 2:
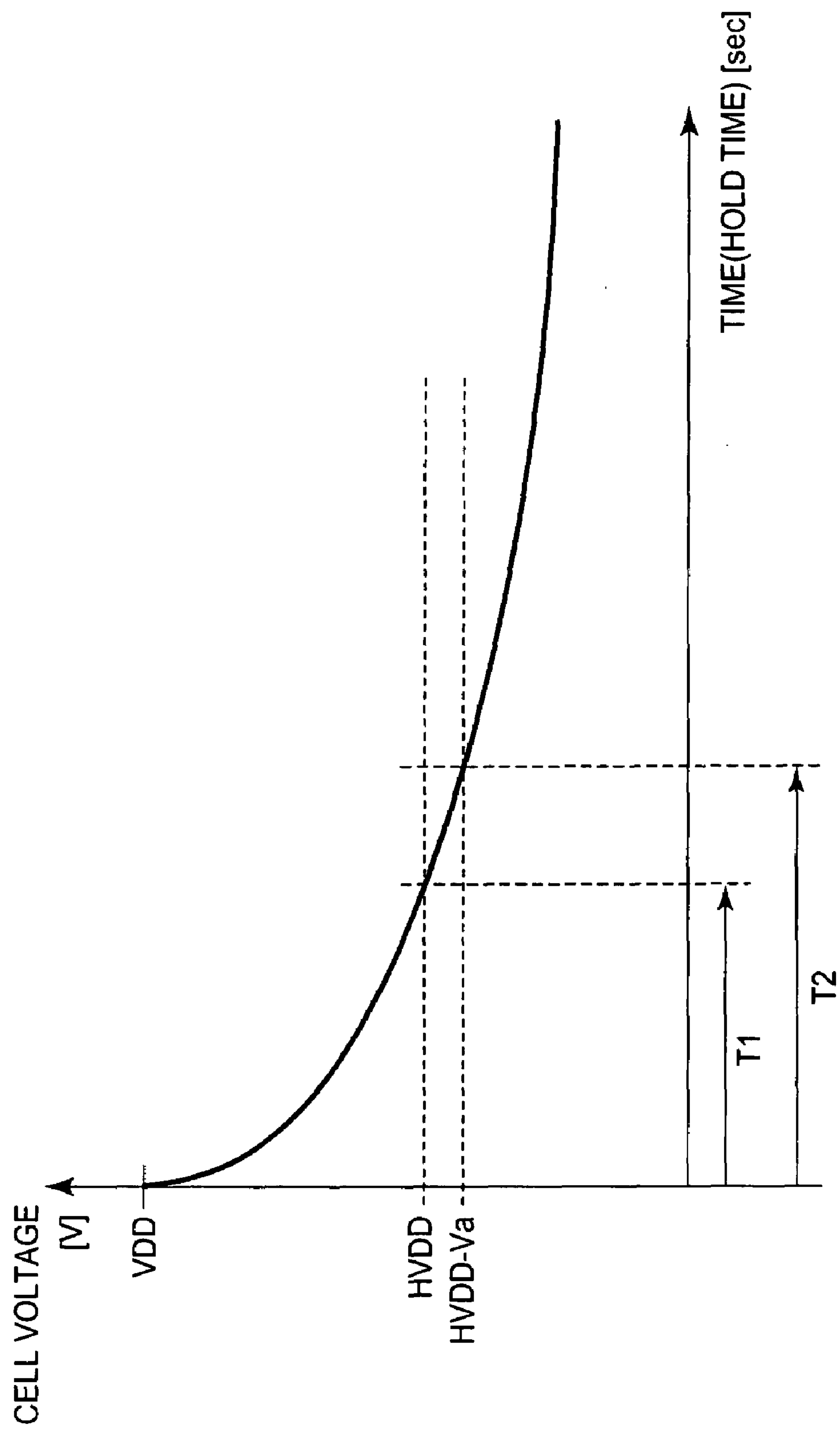
FIG. 2 illustrates characteristics of change in a cell voltage according to Embodiment 1.

Here, charge holding characteristics of the memory cell 11 are described. The memory cell 11 holds charge stored in the capacitor C when the gate transistor GTr is nonconductive. However, junction leakage current is generated between a source region and a well region of the gate transistor GTr. Therefore, even if the gate transistor GTr remains nonconductive, charge stored in the capacitor C decreases over time due to the junction leakage current. FIG. 2 illustrates the charge holding characteristics of the memory cell 11.

As illustrated in FIG. 2, a cell voltage generated according to the amount of charge stored in the capacitor C decreases over time. In this case, time from a point where the gate transistor GTr becomes nonconductive to a point where the cell voltage becomes HVDD is designated as time T1. Time from a point where the gate transistor GTr becomes nonconductive to a point where the cell voltage becomes HVDD−Va is designated as time T2. Because, as illustrated in FIG. 2, the charge holding characteristics of the memory cell 11 is such that the reduction rate of the cell voltage decreases over time, the time T2 is longer than the time T1.

This makes it known that, when the sense amplifier 41 compares the cell voltage with a comparison voltage (in the present embodiment, referred to as "precharge voltage"), as the comparison voltage becomes lower, the voltage range and time where it is determined that the cell voltage is at a HIGH level become larger. This can be used to make longer the interval between refresh operations. In the present embodiment, the precharge voltage is HVDD−Va, which is lower than HVDD by the offset voltage Va. Specifically, the DRAM according to the present embodiment can make the interval between the refresh operations longer than the interval when the precharge voltage is HVDD, and can lower the power consumption in the refresh operations.

Figure 3:
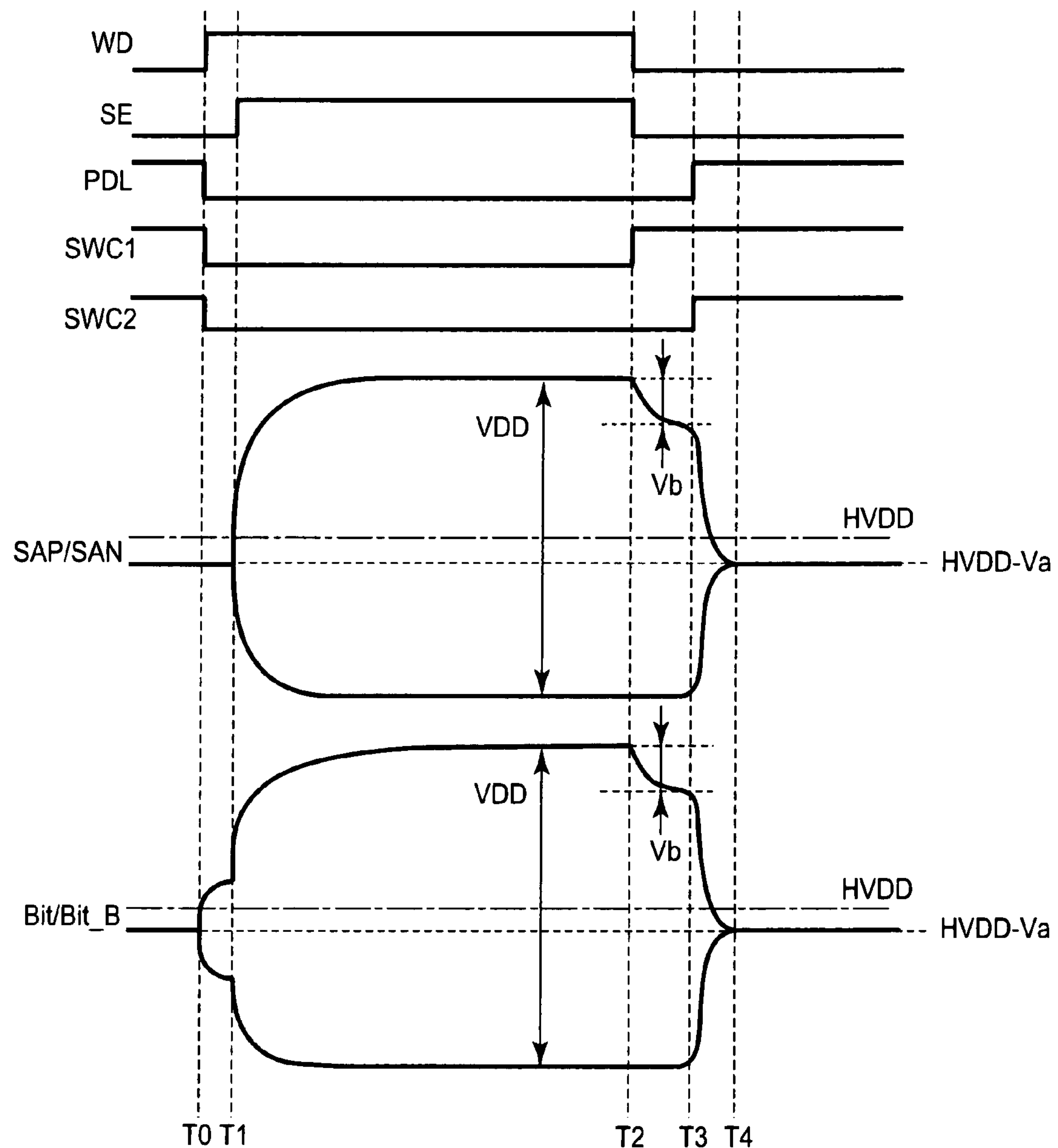
FIG. 3 is a timing chart of an operation of the equalizer circuit according to Embodiment 1.

Here, the refresh operation of the DRAM 1 according to Embodiment 1 is described. It should be noted that, although, in the following, the refresh operation of the DRAM 1 is described, similar operation is performed in reading/writing data from/in the DRAM 1 and the like. FIG. 3 is a timing chart of the refresh operation of the DRAM 1 according to Embodiment 1.

The refresh operation of the DRAM 1 starts at a time T0. Here, the levels of the precharge control signal PDL, the first control signal SWC1, and the second control signal SWC2 are changed from HIGH to LOW. This makes nonconductive the bit line equalizer circuit 21 and the SA equalizer circuit 50. Further, the level of the word control signal WD is changed from LOW to HIGH. This starts reading out data from the memory cell, and minute potential difference is caused between the bit lines Bit and Bit_B. At a time T1 where desired potential difference is caused, by changing the level of the third control signal SE from LOW to HIGH, the gate transistor GTr and the power supply switches VDD_SW and VSS_SW are made conductive. Therefore, the power supply voltage VDD is supplied to the high-voltage-side power supply wiring SAP while the ground voltage VSS is supplied to the low-voltage-side power supply wiring SAN.

This starts operation of the sense amplifier 41. The voltage of the high-voltage-side power supply wiring SAP and the voltage of the low-voltage-side power supply wiring SAN are supplied through the sense amplifier 41 to the bit lines Bit and Bit_B to make larger the voltage difference between the bit lines Bit and Bit_B. In this case, the relationship between the voltages of the bit lines Bit and Bit_B is determined according to the amount of charge stored in the capacitor C of the memory cell 11. Further, the voltage difference between the bit lines Bit and Bit_B is substantially the same as the voltage difference between the power supply voltage VDD and the ground voltage VSS.

After a predetermined time elapses from the time T1, and the capacitor C is sufficiently charged and the refresh operation is completed, at a time T2, the level of the word control signal WD is changed from HIGH to LOW. This disconnects the capacitor C from the bit line Bit. Further, the level of the third control signal SE is changed from HIGH to LOW. This disconnects the high-voltage-side power supply wiring SAP and the low-voltage-side power supply wiring SAN from the power supply terminal and the ground terminal, respectively. Further, the level of the first control signal SWC1 is changed from LOW to HIGH. This makes conductive only the NMOS transistor N1 among all the NMOS transistors included in the SA equalizer circuit 50. Therefore, the SA reference voltage generating circuit 60 is connected to the high-voltage-side power supply wiring SAP. In this case, because the precharge voltage HVDD−Va generated by the SA reference voltage generating circuit 60 is lower than the power supply voltage VDD supplied to the high-voltage-side power supply wiring SAP, the voltage of the high-voltage-side power supply wiring SAP drops.

The amount of the voltage drop Vb is, for example, preferably on the order of twice as high as the offset voltage Va. In the present embodiment, the amount of the voltage drop Vb is 2Va, and, for example, on the order of 0.2 V. In this case, time necessary for the voltage drop is, for example, on the order of 2 nsec. Further, the change rate of the voltage of the high-voltage-side power supply wiring SAP in this case depends on the ON resistance of the NMOS transistor N1 and the parasitic capacitance of the high-voltage-side power supply wiring SAP and the like. Further, because, in this state, the sense amplifier 41 becomes inactive at the time T2 and its driving ability is lost, the voltage of a bit line of the pair which is higher than that of the other bit line of the pair drops as the voltage of the high-voltage-side power supply wiring SAP changes. It should be noted that, at the time T2, the levels of the precharge control signal PDL and the second control signal SWC2 remain LOW. Specifically, the bit line equalizer circuit 21 and the NMOS transistors N2 and N3 of the SA equalizer circuit 50 remain nonconductive.

Then, at a time T3, the levels of the precharge control signal PDL and the second control signal SWC2 are changed from LOW to HIGH. This makes conductive the NMOS transistors N1 to N3 of the SA equalizer circuit 50, and the voltage of the high-voltage-side power supply wiring SAP becomes substantially the same as the voltage of the low-voltage-side power supply wiring SAN. The voltages of the high-voltage-side power supply wiring SAP and the low-voltage-side power supply wiring SAN in this case are (VDD−Vb)/2 (for example, (VDD−2Va)/2), which is the same as the precharge voltage HVDD−Va. On the other hand, with regard to the bit line equalizer circuit 21, because the NMOS transistors EN1 to EN3 are made conductive, the voltages of the bit line pair become substantially the same. The voltages of the bit line pair here are (VDD−Vb)/2 (for example, (VDD−2Va)/2), which is the same as the precharge voltage HVDD−Va. It should be noted that the levels of the word control signal WD, the first control signal SWC1, and the third control signal SE at the time T3 remain the same as the levels after the change at the time T2.

After the time T3, the voltage changes of the power supply wiring pair and the bit line pair converge to a point at a time T4. In this case, because the NMOS transistor N2 of the SA equalizer circuit 50 is conductive, charge moves from the high-voltage-side power supply wiring SAP of the power supply wiring pair through the NMOS transistor N2 toward the low-voltage-side power supply wiring SAN. This makes the voltages of the power supply wiring pair go up/down from those at the time T3 substantially by half of the voltage difference at the time T3. Specifically, when the precharge voltage is HVDD−Va, by making VDD−2Va the voltage difference of the power supply wiring pair at the time T3, the voltages of the power supply wiring pair when they become the same at the time T4 can be made to be the precharge voltage HVDD−Va. Further, because the NMOS transistor EN2 of the bit line equalizer circuit 21 is made conductive at the time T3, the bit line pair is operated similarly to the power supply wiring pair. Specifically, with regard to the operation after the time T3, there is almost no input/output of current to/from the bit line reference voltage generating circuit 30 and the SA reference voltage generating circuit 60. Therefore, the current driving abilities of the bit line reference voltage generating circuit 30 and the SA reference voltage generating circuit 60 during this time period are not required to be so high.

Figure 4:
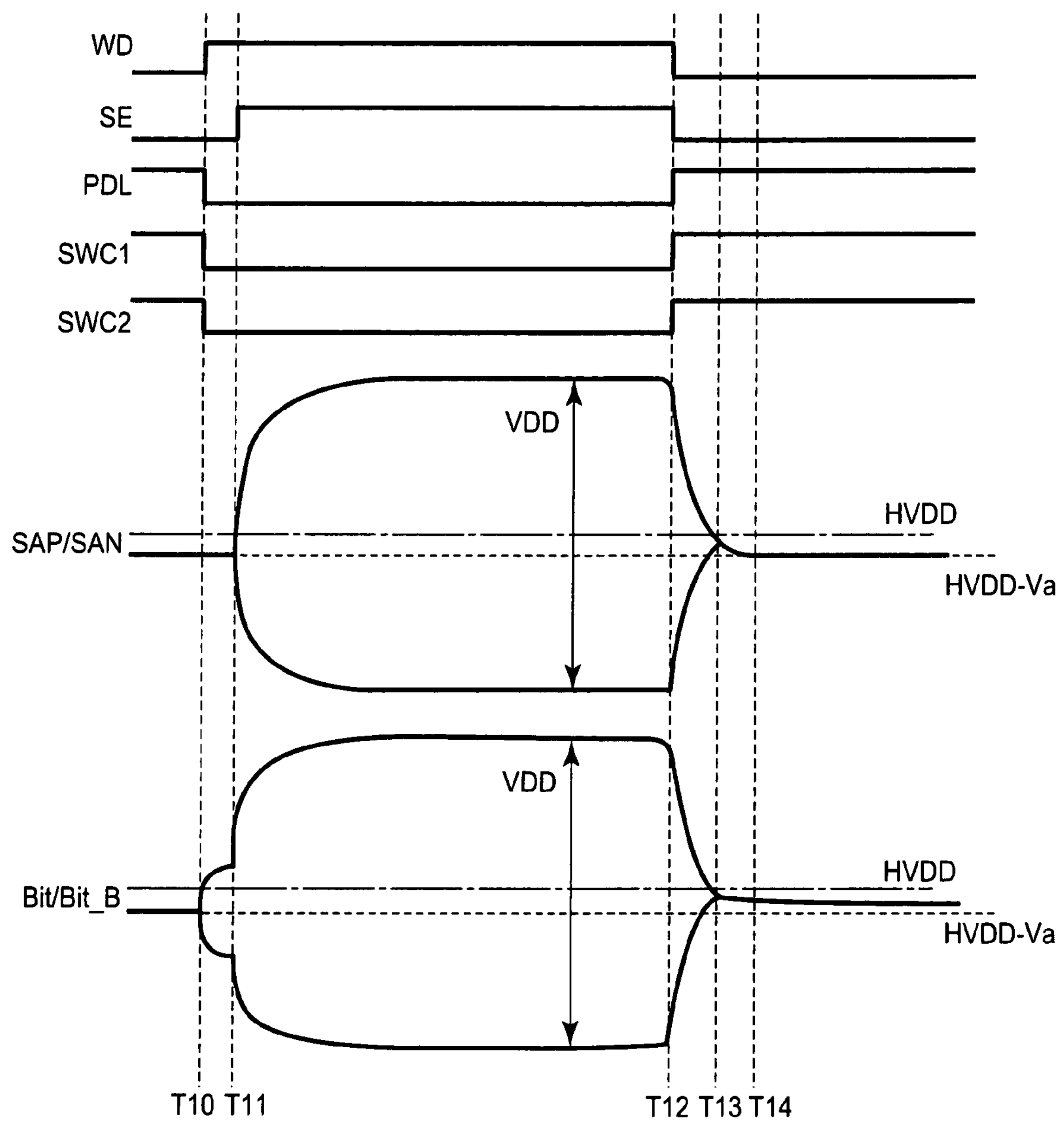
FIG. 4 is a timing chart of an operation of the equalizer circuit according to Embodiment 1 when a discharge operation is not performed.

In the following, the refresh operation of the DRAM 1 when the first control signal SWC1 and the second control signal SWC2 are controlled in the same way is described. This is a case where the control during the time period from the time T2 to the time T3 in the timing chart of FIG. 3 (hereinafter referred to as "discharge time period") is removed. In the conventional DRAM, the speed of the precharge operation is made high by making the precharge voltage HVDD using the equalizer circuit. Therefore, the refresh operation without the discharge time period is the method of controlling the equalizer circuit in the refresh operation of the conventional DRAM. FIG. 4 is a timing chart of this case. It should be noted that, although, in FIG. 4, the control signals SWC1 and SWC2 are illustrated separately in order to make clear the difference from the present invention, in reality, it is preferable that the signals be not separate and be one control signal.

In this case, operation at times T10 and T11 are the same as that at the times T0 and T1 in FIG. 3. Then, at a time T12, the levels of the word control signal WD and the third control signal SE are changed from HIGH to LOW. This makes nonconductive the gate transistor GTr and the power supply switches VDD_SW and VSS_SW. Therefore, the high-voltage-side power supply wiring SAP is disconnected from the power supply terminal while the low-voltage-side power supply wiring SAN is disconnected from the ground terminal. Further, at the time T12, the levels of the precharge control signal PDL, the first control signal SWC1, and the second control signal SWC2 are changed from LOW to HIGH. This makes conductive the bit line equalizer circuit 21 and the SA equalizer circuit 50. Therefore, the voltages of the power supply wiring pair and the bit line pair converge to substantially the same voltage (at a time T13). The voltages of the power supply wiring pair and the bit line pair in this case are slightly lower than HVDD. After that, the voltages of the power supply wiring pair become the precharge voltage HVDD−Va according to the current driving ability of the SA reference voltage generating circuit 60 (at a time T14). The voltages of the bit line pair also become the precharge voltage HVDD−Va according to the current driving ability of the bit line reference voltage generating circuit 30, but it takes a long time until the voltages reach HVDD−Va.

This is because the current limiting resistor R is inserted in the bit line equalizer circuit 21. Specifically, because the current limiting resistor R limits the current driving ability of the bit line reference voltage generating circuit 30, it takes a long time to take charge away from the bit line pair.

As described above, when the precharge voltage is made to be lower than HVDD in order to make longer the charge holding time of the memory cell 11, according to the conventional control method without the discharge time period, it takes a long time until the voltages of the bit lines of the pair become the precharge voltage. On the other hand, the SA equalizer circuit 50 according to Embodiment 1 can generate the discharge time period by shifting the control timing of the NMOS transistor N1 and the NMOS transistors N2 and N3. Specifically, it is possible to make, during the discharge time period, the voltage differences between the power supply wiring pair and the bit line pair twice as high as the precharge voltage whose voltage is lower than HVDD. By making the SA equalizer circuit 50 and the bit line equalizer circuit 21 conductive after that, the voltages of the power supply wiring pair and the bit line pair converge to the precharge voltage HVDD−Va which is lower than HVDD. Because the voltages of the power supply wiring pair and the bit line pair after the convergence are substantially the same as the precharge voltage HVDD−Va, time after the discharge time period until the precharge operation is completed is substantially the same as that of the conventional case.

It should be noted that, although the SA equalizer circuit 50 according to the present embodiment requires the discharge time period, the discharge time period is far shorter than the time until the voltages of the bit line pair converge to the precharge voltage HVDD−Va in the conventional control method. This is because the SA reference voltage generating circuit 60 can rapidly take charge away from the high-voltage-side power supply wiring SAP due to lack of current limiting resistor R in the SA equalizer circuit 50. Therefore, according to the present embodiment, the DRAM 1 can make longer the charge holding time of the memory cells 11 and still can materialize high speed precharge operation making use of the precharge voltage HVDD−Va which is lower than HVDD. Specifically, a DRAM with a longer interval between the refresh operations and lowered power consumption in the refresh operations which can be operated at high speed can be materialized.

Although, in the above-mentioned embodiment, the current limiting resistor R is not inserted in the SA equalizer circuit 50, it may be inserted. However, in such a case, there is a problem that the discharge time period becomes longer. On the other hand, when the current limiting resistor R is not inserted in the SA equalizer circuit 50, there is an effect that, during a time period after the precharge operation is started (after the time T3 of FIG. 3) where the sense amplifier 41 is inactive, the change in the voltages of the bit line pair becomes more rapid. This can make higher the speed of the precharge operation.

Embodiment 2

In the DRAM 1 according to Embodiment 1, there is an out of balance state with regard to charge movement during the discharge time period where charge is taken away only from the high-voltage-side power supply wiring SAP. Therefore, when the output current driving ability of the SA reference voltage generating circuit 60 is low, the charge which is taken away can not be absorbed (or discharged), and thus, there arises a problem in that the voltage level of the precharge voltage to be generated is deviated. This problem becomes more conspicuous when the refresh operation is repeatedly performed. If the size of the output transistor of the SA reference voltage generating circuit 60 is made larger in order to solve this problem, another problem arises that the size of the chip becomes larger.

Figure 5:
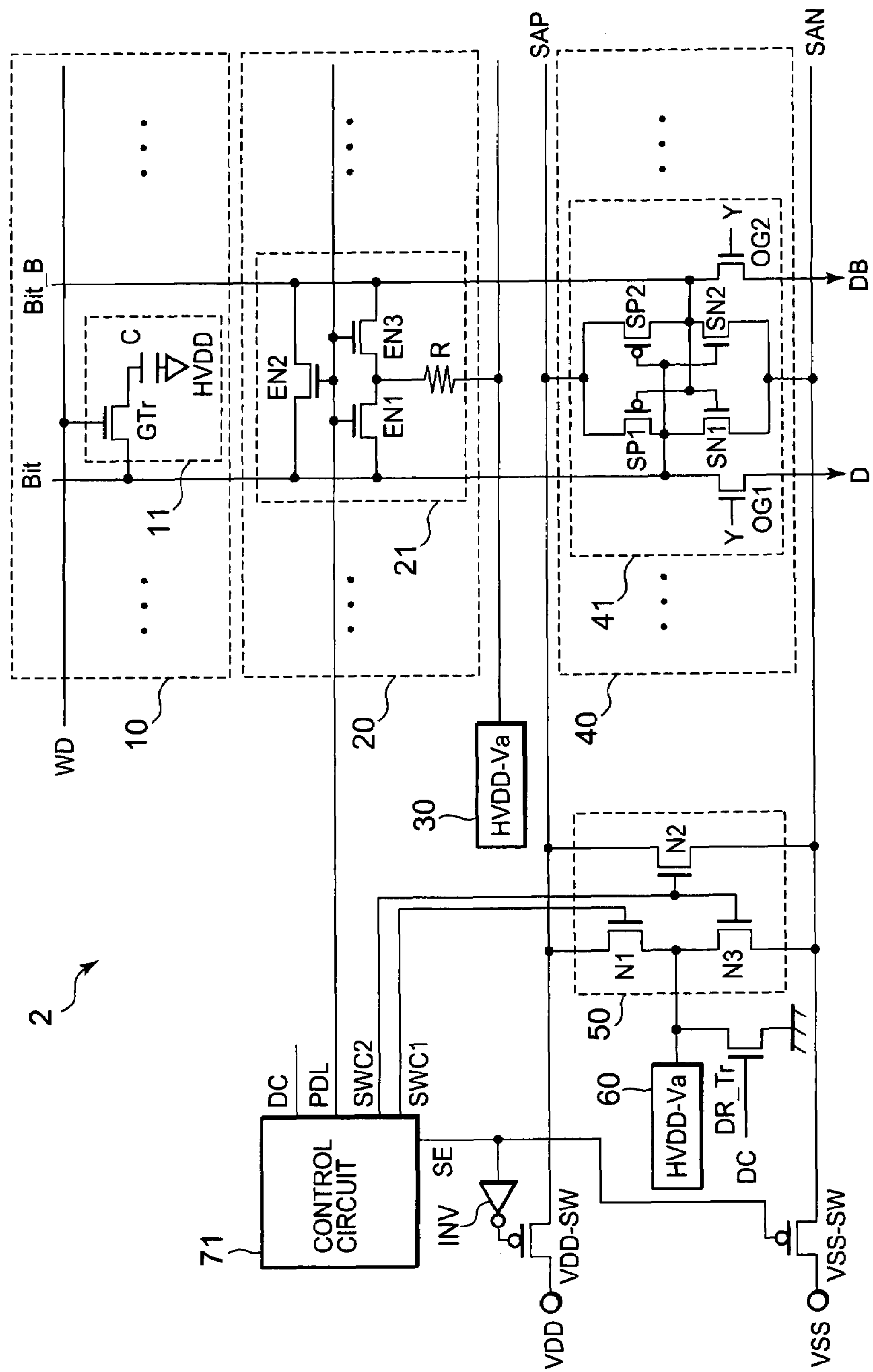
FIG. 5 is a circuit diagram of a DRAM having an equalizer circuit according to Embodiment 2 of the present invention.

Accordingly, in a DRAM 2 according to Embodiment 2, a drain transistor DR_Tr is added to the DRAM 1 according to Embodiment 1. FIG. 5 is a circuit diagram of the DRAM 2 according to Embodiment 2. In FIG. 5, elements which are the same as those described in Embodiment 1 bear the same reference numerals, and description thereof is omitted.

The drain transistor DR_Tr is conductive during the discharge time period, and charge taken away from the high-voltage-side power supply wiring SAP by the NMOS transistor N1 of the SA equalizer circuit 50 is discharged to the ground voltage. The drain transistor DR_Tr is, for example, a transistor whose conductivity type is the same as that of the NMOS transistor N1, and preferably has a transistor size or current driving ability comparable to that of the NMOS transistor N1. This can make the amount of charge taken away from the high-voltage-side power supply wiring SAP by the NMOS transistor N1 substantially the same as the amount of charge discharged by the drain transistor DR_Tr.

The drain transistor DR_Tr is connected between a wiring for connecting the SA equalizer circuit 50 to the SA reference voltage generating circuit 60 and the ground voltage. The conductivity of the drain transistor DR_Tr is controlled based on a drain control signal DC outputted by a control circuit 71. It should be noted that the control circuit 71 is the control circuit 70 according to Embodiment 1 having the function of outputting the drain control signal DC added thereto.

Figure 6:
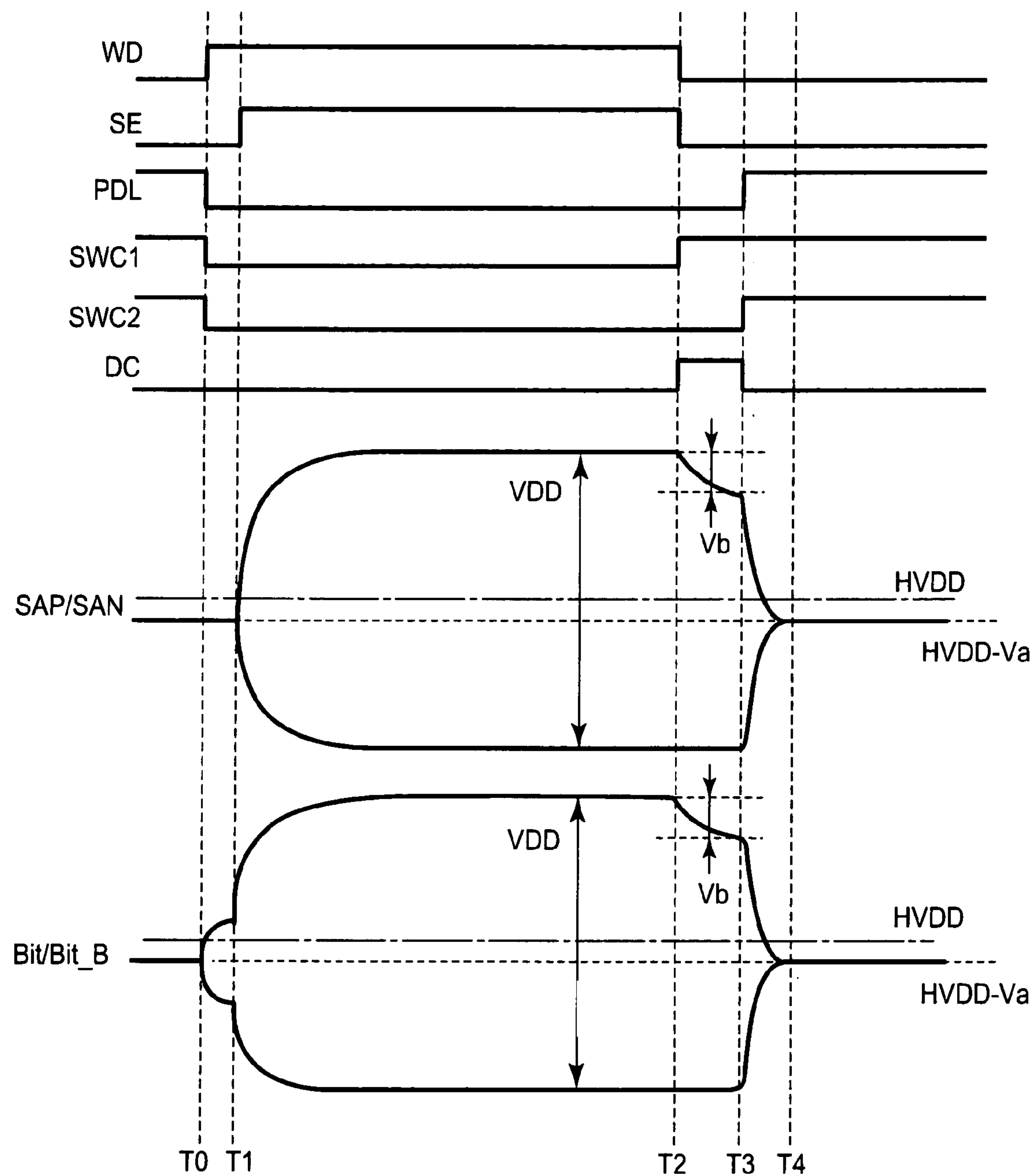
FIG. 6 is a timing chart of an operation of the equalizer circuit according to Embodiment 2.

FIG. 6 is a timing chart of the refresh operation of the DRAM 2 according to Embodiment 2. The refresh operation of the DRAM 2 is now described with reference to FIG. 6. As illustrated in FIG. 6, the refresh operation of the DRAM 2 is substantially the same as that of the DRAM 1 from the time T0 where the refresh operation is started to the time T2. During the discharge time period from the time T2 to the time T3, the level of the drain control signal DC is HIGH. This makes conductive the drain transistor DR_Tr. By this, charge taken away from the high-voltage-side power supply wiring SAP by the NMOS transistor N1 is discharged by the drain transistor DR_Tr to the ground voltage.

As described above, in the DRAM 2 according to Embodiment 2, charge taken away from the high-voltage-side power supply wiring SAP by the NMOS transistor N1 during the discharge time period can be discharged by the drain transistor DR_Tr. This eliminates the necessity of a current driving ability of the SA reference voltage generating circuit 60 according to Embodiment 2 for discharging charge taken away from the high-voltage-side power supply wiring SAP by the NMOS transistor N1. Specifically, it is not necessary to make larger the size of the output transistor of the SA reference voltage generating circuit 60 according to Embodiment 2. Therefore, the size of the chip of the DRAM 2 according to Embodiment 2 can be made smaller than that of the DRAM 1 according to Embodiment 1.

It should be noted that, when there are a plurality of SA equalizer circuits 50, it is preferable that the current driving ability of the drain transistor be equivalent to the sum of the current driving abilities of the NMOS transistors N1 of the plurality of SA equalizer circuits 50. This makes it possible to discharge charge taken away by the NMOS transistors N1 to the side of the ground voltage without overs and shorts.

Embodiment 3

Figure 7:
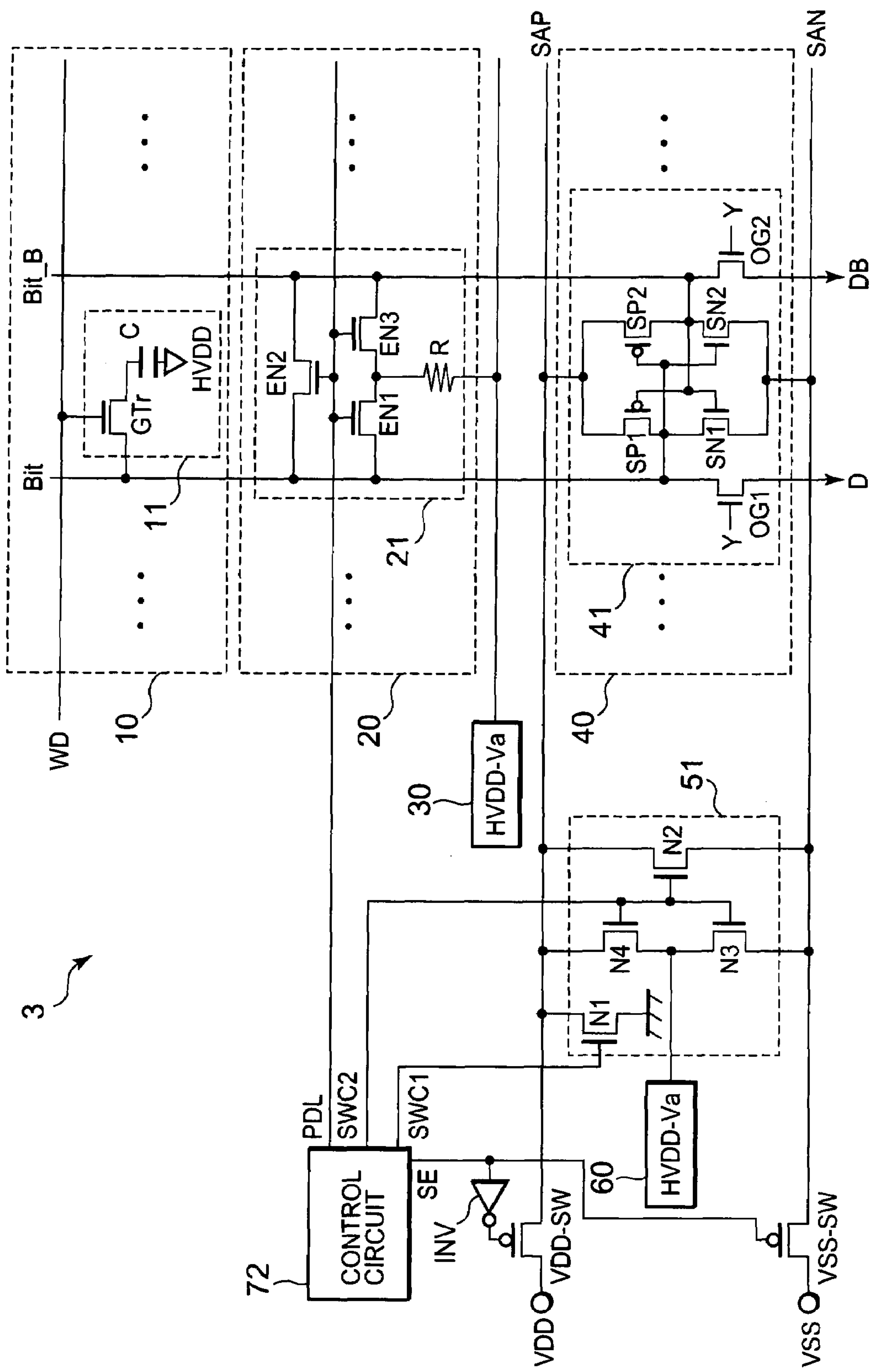
FIG. 7 is a circuit diagram of a DRAM having an equalizer circuit according to Embodiment 3 of the present invention.

FIG. 7 is a circuit diagram of a DRAM 3 according to Embodiment 3. As illustrated in FIG. 7, an SA equalizer circuit 51 of the DRAM 3 has a first transistor (for example, NMOS transistor N1) connected between a first wiring (for example, high-voltage-side power supply wiring SAP) and a ground voltage. It should be noted that a first control signal SWC1 is supplied to a gate of the NMOS transistor N1. Instead of the NMOS transistor N1 of the SA equalizer circuit 50 of Embodiment 1, a fourth transistor (NMOS transistor N4) is disposed. A second control signal SWC2 is supplied to a gate of the NMOS transistor N4. It should be noted that the first control signal SWC1 and the second control signal SWC2 in the present embodiment are generated by a control circuit 72. In other words, a discharge path from the power supply wiring SAP to a source voltage of the NMOS transistor N1 is activated at a time when the first control signal is activating before the second control signal is activating.

Figure 8:
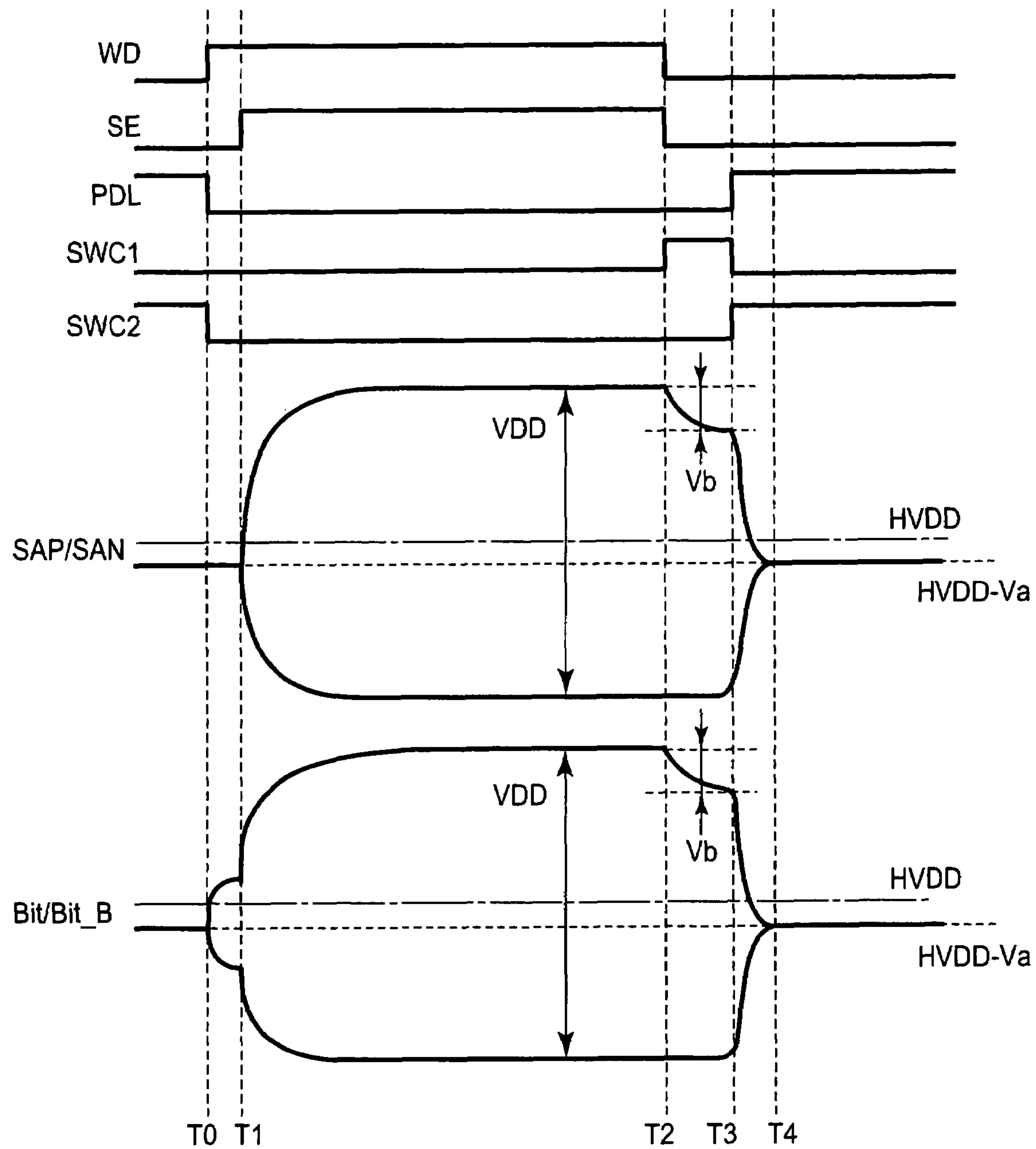
FIG. 8 is a timing chart of an operation of the equalizer circuit according to Embodiment 3.
Figure 9:
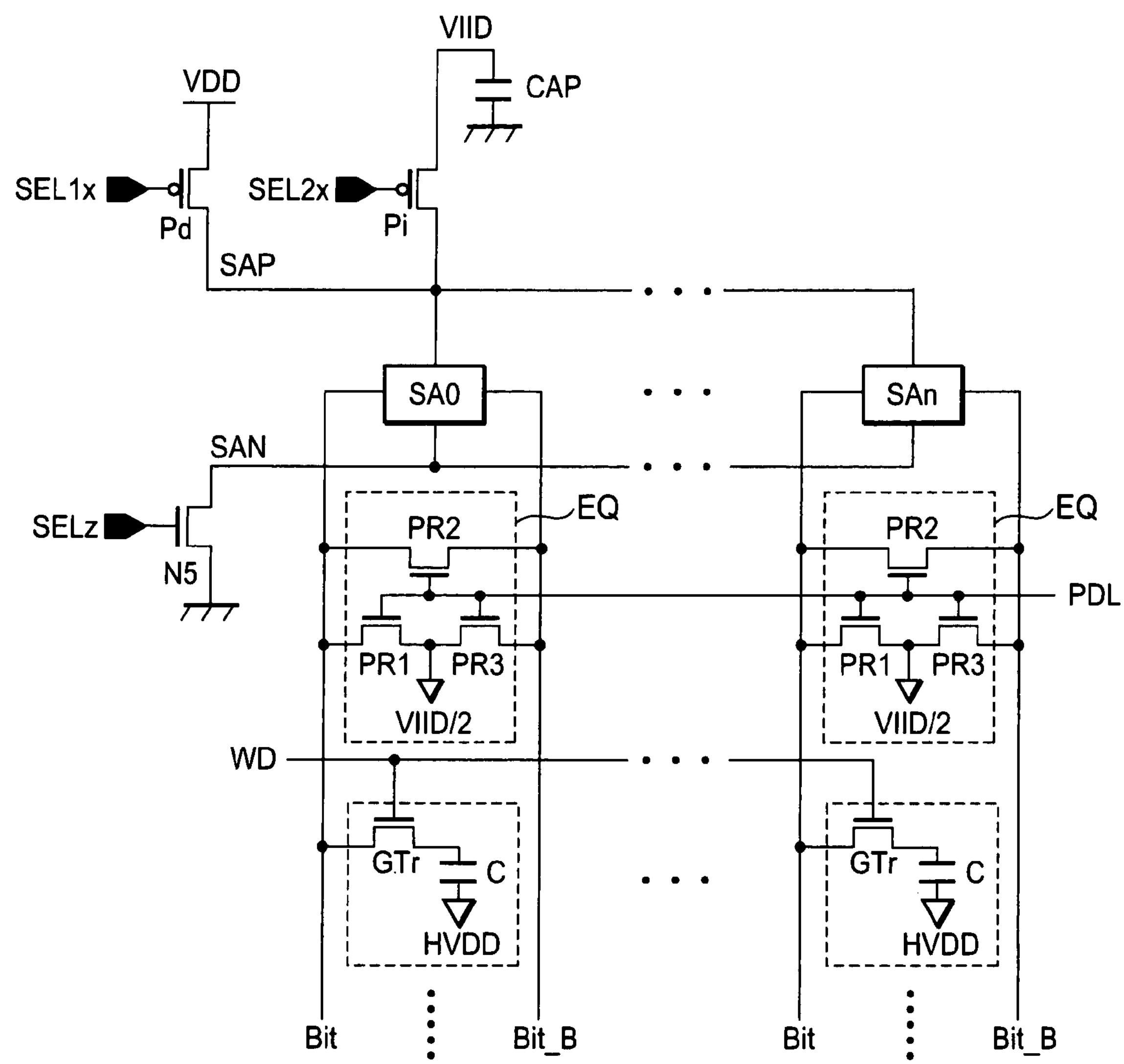
FIG. 9 is a circuit diagram of a conventional DRAM.
Figure 10:
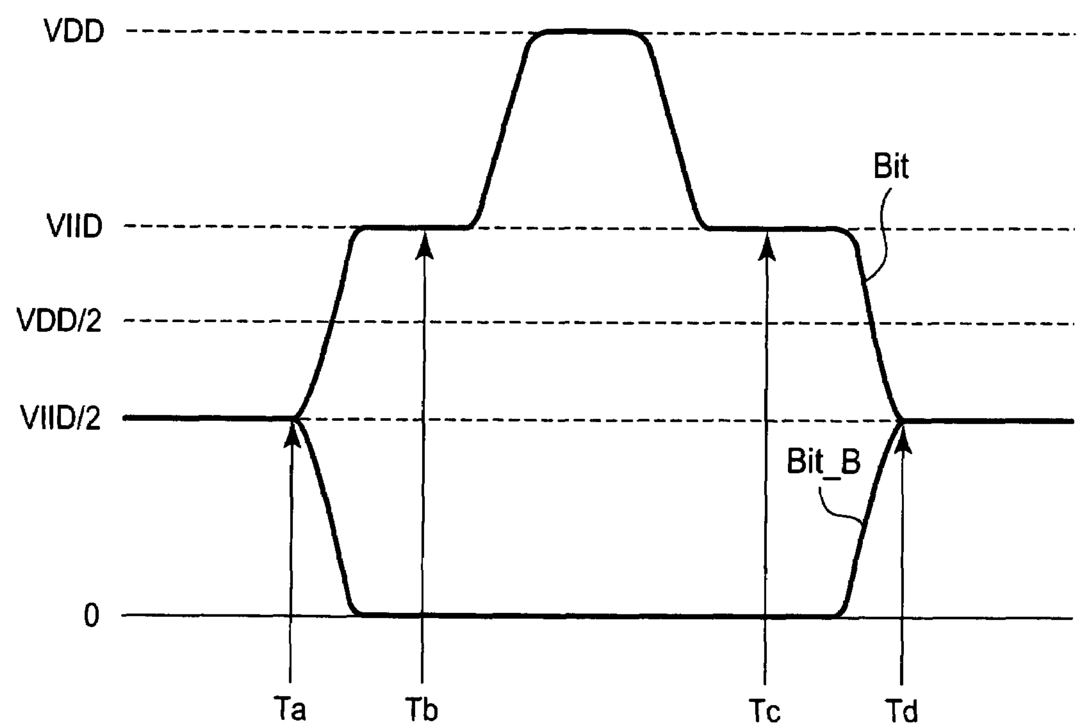
FIG. 10 is a timing chart illustrating change in voltage of bit lines in the conventional DRAM.

FIG. 8 is a timing chart of the refresh operation of the DRAM 3 according to Embodiment 3. The refresh operation of the DRAM 3 is now described with reference to FIG. 8. As illustrated in FIG. 8, during the refresh operation of the DRAM 3, the operation of the word control signal WD, the third control signal SE, the precharge control signal PDL, and the second control signal SWC2 are substantially the same as that of the DRAM 1. The level of the first control signal SWC1 is HIGH during the discharge time period from the time T2 to the time T3 and is LOW during the rest of the time period.

Specifically, in the DRAM 3, by making the NMOS transistor N1 conductive during the discharge time period, charge of the high-voltage-side power supply wiring SAP is discharged to the ground voltage. This drops the voltage of the high-voltage-side power supply wiring SAP. After that, by making the NMOS transistors N2 to N4 conductive, the voltage of the high-voltage-side power supply wiring SAP is made to be substantially the same as that of the low-voltage-side power supply wiring SAN. The voltage obtained at this time is a reference voltage HVDD−Va generated by the SA reference voltage generating circuit 60.

As described in the above, in the DRAM 3 according to Embodiment 3, by connecting a source of the NMOS transistor N1 to the ground potential, taking charge away from the high-voltage-side power supply wiring SAP and discharging the charge which is taken away can be performed simultaneously. In this case, the voltage between the source and the drain of the NMOS transistor N1 according to Embodiment 3 is higher than the voltage between the source and the drain of the NMOS transistor N1 according to Embodiment 1. Therefore, when the amount of voltage drop in the high-voltage-side power supply wiring SAP is the same, the NMOS transistor N1 according to Embodiment 3 can drop the voltage of the high-voltage-side power supply wiring SAP in a shorter period of time than the NMOS transistor N1 according to Embodiment 1. Further, by making larger the size of the NMOS transistor N1 to make higher the current driving ability of the transistor, time necessary for taking charge away from the high-voltage-side power supply wiring SAP can be made shorter.

Further, although, in Embodiment 2, the wiring for supplying the control signal DC to the drain transistor DR_Tr is necessary, the wiring is not necessary in Embodiment 3, and only a wiring region similar to that of Embodiment 1 is necessary. Specifically, the DRAM 3 according to Embodiment 3 can reduce the area of the wiring region compared with the case of the DRAM 2 according to Embodiment 2.

It should be noted that, although, in the above-mentioned embodiments, the SA equalizer circuit has been described, it is also possible to employ a structure in which a group of a plurality of NMOS transistors N2 to N4 are provided for one NMOS transistor N1.

It should be noted that the present invention is not limited to the above-mentioned embodiments and various variations and modifications are possible which fall within the scope of the present invention. Although, in the above-mentioned embodiments, the case where a high cell voltage is held has been described. The present invention may also be applied to a case where a holding time of a low cell voltage is made longer. In that case, the control may be appropriately changed. For example, the precharge voltage may be set to be higher than HVDD, and the voltage of the low-voltage-side power supply wiring SAN may be raised during the discharge time period. In this case, the drain transistor DR_Tr and the first transistor according to Embodiment 3 may be PMOS transistors having sources being connected to the power supply voltage.

What is claimed is:

1. An equalizer circuit for setting voltages of a first wiring and a second wiring to be substantially the same, comprising:

a first power supply circuit;

a first transistor connected between the first wiring and the first power supply circuit and having a control terminal receiving a first control signal; and a second transistor connected between the first wiring and the second wiring and having a control terminal receiving a second control signal different from the first control signal;

wherein said first transistor is activated faster than said second transistor in a precharge operation, and wherein said control signals have a same voltage range.

2. An equalizer circuit according to claim 1, wherein:

the first power supply circuit is supplied with a reference voltage generated by a reference voltage generating circuit; and the voltages of the first wiring and the second wiring are set to be substantially the same based on the reference voltage.

3. The equalizer circuit according to claim 2, further comprising a third transistor which is connected between the first power supply circuit and the second wire.

4. The equalizer circuit according to claim 2, wherein said third transistor has a current driving ability equivalent to that of the first transistor.

5. The equalizer circuit according to claim 3, wherein, when the first transistor is provided with respect to a plurality of first transistors, the third transistor has a current driving ability equivalent to a sum of the current driving abilities of the plurality of first transistors.

6. The equalizer circuit according to claim 2, wherein the reference voltage has an offset with respect to a midpoint voltage of voltages supplied to the first wiring and the second wiring.

7. The equalizer circuit according to claim 6, wherein the reference voltage is lower than the midpoint voltage of the voltages supplied to the first wiring and the second wiring.

8. The equalizer circuit according to claim 2, wherein the equalizer circuit further comprises a current limiting resistor connected between the reference voltage generating circuit and the first transistor.

9. The equalizer circuit according to claim 1 wherein the equalizer circuit is connected between a pair of wirings in a volatile semiconductor memory device.

10. The equalizer circuit according to claim 9, wherein the volatile semiconductor memory device comprises a DRAM.

11. The equalizer circuit according to claim 1, wherein the first power supply circuit has a ground voltage or a power supply voltage.

12. An equalizer circuit for setting voltages of a first node and a second node to be substantially the same, comprising:

a first node having a first voltage;

a second node having a second voltage;

a first current path coupled to said first node to change the first voltage at said first node, said first node thereby being set to a voltage different from said first voltage; and a second current path provided between said first node and said second node to cause said first and second nodes having substantially the same voltage with each other, said substantially the same voltage being different from an average of said first voltage and said second voltage.

13. The equalizer circuit according to claim 12, wherein said second current path connects said first node to said second node.

14. The equalizer circuit according to claim 12, wherein said second current path is connected in series with said first current path between said first node and said second node.

* * * * *